United States Patent
Ker et al.

(10) Patent No.: US 7,564,295 B2
(45) Date of Patent: Jul. 21, 2009

(54) AUTOMATIC BIAS CIRCUIT FOR SENSE AMPLIFIER

(75) Inventors: Po-Yao Ker, Dashe Township, Kaohsiung County (TW); Shine Chung, Taipei Hsien (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/769,611

(22) Filed: Jun. 27, 2007

(65) Prior Publication Data
US 2009/0002058 A1  Jan. 1, 2009

(51) Int. Cl.
 *H01H 37/76* (2006.01)
 *H01H 85/00* (2006.01)
(52) U.S. Cl. ............... 327/525; 327/51; 327/52; 327/53
(58) Field of Classification Search ............ 327/51, 327/52, 525, 53
See application file for complete search history.

(56) References Cited

U.S. PATENT DOCUMENTS

| 5,731,733 | A  | * | 3/1998  | Denham .............. 327/525 |
| 6,906,557 | B1 | * | 6/2005  | Parker et al. ........... 327/53 |
| 2005/0285663 | A1 | * | 12/2005 | Newman .............. 327/525 |
| 2006/0044049 | A1 | * | 3/2006  | Ouellette et al. ....... 327/525 |

* cited by examiner

*Primary Examiner*—Kenneth B Wells
*Assistant Examiner*—John W Poos
(74) *Attorney, Agent, or Firm*—K & L Gates LLP

(57) ABSTRACT

The present invention discloses a bias circuit for a sense amplifier having a device under sensing, the device under sensing having an un-programmed state and a programmed state, the bias circuit comprises at least one first branch having at least one first device formed substantially the same as the device under sensing and remaining in the un-programmed state, and at least one second device formed also substantially the same as the device under sensing and being in the programmed state, wherein the at least one first device and the at least one second device are serially connected. A typical application of the present invention is an electrical fuse memory.

20 Claims, 4 Drawing Sheets

AUTOMATIC BIAS CIRCUIT FOR SENSE AMPLIFIER

BACKGROUND

The present invention relates generally to integrated circuit (IC) design, and more particularly to a bias circuit for sense amplifiers.

A sense amplifier (SA) is an instrument to read data from a memory cell by comparing the memory cell state with a known state. If the memory cell state is higher than the known state, the SA may output a "1", for instance, and if the memory cell state is lower than the known state, the SA may output a "0" instead. In SA design, a bias circuit is intended to set and maintain a direct current (DC) bias point for the SA, allowing it to operate at an appropriate point in the SA's transfer characteristic. Thus the bias circuit must provide bias stability when there are variations in input signals, circuit parameters, or circuit conditions. The circuit parameters may be affected by manufacturing processes. The circuit conditions include temperature and voltage under which the SA is operating. The bias circuit used for the SA will have significant effect on the operation of the SA.

FIGS. 1A and 1B are schematic diagrams illustrating two conventional bias circuits 100 and 150. Referring to FIG. 1A, NMOS transistors 103 and 113 provide bias for NMOS transistors 106 and 116. For stable and linear operations, the NMOS transistors 106 and 116 are both biased to operate in a saturation region. When in a saturation region and in an ideal situation, the NMOS transistor 116 may be viewed as a resistive load, and the NMOS transistor 106 functions as a constant current source, then a voltage at node A becomes a constant voltage between a positive power supply voltage (Vcc) and a ground (GND) at node A. If the NMOS transistor 106 and 116 are of the same size, then the voltage at node A equals one half of the Vcc.

Referring to FIG. 1B, the load NMOS transistors 113 and 116 are replaced by two resistors 153 and 156, respectively. But the bias circuit 150 of FIG. 1B operates just the same as the bias circuit 100 of FIG. 1A. Unfortunately, in the real world, situations are never ideal. Conditions such as non-linear saturation of the NMOS transistors 103 and 106, process variations or voltage/temperature fluctuations, all make the voltage at node A unstable. Most important is that the process, voltage and temperature fluctuations is unpredictable, and the conventional bias circuits such as 100 and 150 of FIGS. 1A and 1B, respectively, do not track variations in the device under the sensing. This will make the SA design very difficult and less accurate.

As such, what is desired is a SA bias circuit that can provide a reference to a device under the sensing and capability of automatically tracking variations and fluctuations therein.

SUMMARY

In view of the foregoing, the present invention discloses a bias circuit for a sense amplifier having a device under sensing, the device under sensing having an unprogrammed state and a programmed state, the bias circuit comprises at least one first branch having at least one first device formed substantially the same as the device under sensing and remaining in the un-programmed state, and at least one second device formed also substantially the same as the device under sensing and being in the programmed state, wherein the at least one first device and the at least one second device are serially connected.

According to one embodiment of the present invention, the bias circuit comprises a first module having a first and a second device connected in parallel and both formed substantially the same as the device under sensing and remaining in the un-programmed state, and a second module having a third and a fourth devices connected in parallel and both formed substantially the same as the device under sensing and being in the programmed state, wherein the first and second modules are serially connected.

According to another embodiment of the present invention, the bias circuit comprises a first branch having a first and second devices serially connected and both formed substantially the same as the device under sensing, the first device remaining in the un-programmed state, and the second device being in the programmed state, and a second branch having a third and fourth devices serially connected and both formed substantially the same as the device under sensing, the third device remaining in the unprogrammed state, and the fourth device being in the programmed state, wherein the first and second branches are connected in parallel.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of a bias circuit for biasing a sense amplifier (SA), and according to one embodiment of the present, the bias circuit is used for a fuse SA.

Figure 2:
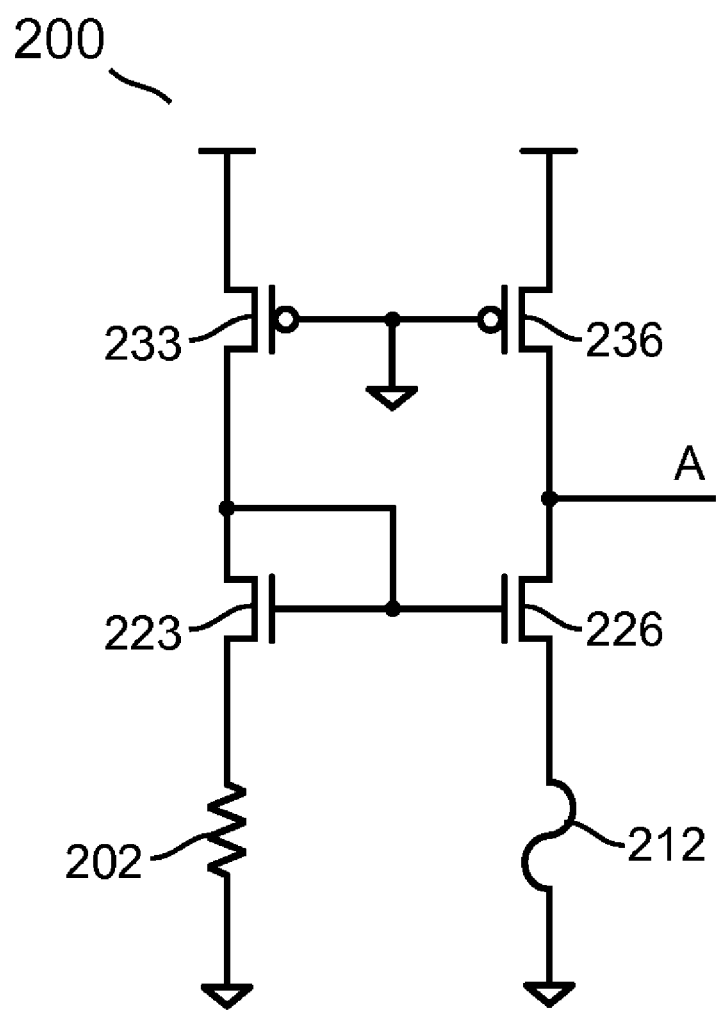
FIG. 2 is a schematic diagram illustrating a conventional fuse sense amplifier.

FIG. 2 is a schematic diagram illustrating a conventional fuse SA 200. A resistive fuse 212 is serially connected with a NMOS transistor 226 and a PMOS transistor 236. A reference resistor 202 is serially connected with another NMOS transistor 223 and another PMOS transistor 233. The resistive fuse 212 has a pre-programmed and a post-programmed resistance value. Node A is supposed to output a first logic state for the pre-programmed fuse, and a complementary logic state for the post-programmed fuse. For that purpose, the NMOS transistors 223 and 226 are typically set to the same size, so too are the PMOS transistors 233 and 236. The reference resistor 202 has a value between the pre-programmed fuse resistance and the post-programmed fuse resistance. When the fuse resistance is higher than the reference resistance, i.e., the fuse 212 is in the post-programmed state, node A outputs a positive higher voltage which is regarded as high state. On the other hand, when the fuse resistance is lower than the reference resistance, i.e., the fuse 212 is in pre-programmed state, node A outputs a positive lower voltage which is regarded as low state. Given the structure shown in FIG. 2, the NMOS transistors 223 and 226 are always in a saturation region, therefore ensuring the fuse SA 200 to have maximized gain.

One having skill in the art recognizes that the performance of the conventional fuse SA 200 relies heavily on resistance differences between the reference resistor 202 and the resistive fuse 212. Especially when the resistive fuse 212 is programmed by electrical means, wherein the resistive fuse 212 has only a small amount of resistance rise due to programming. Ideally, the reference resistance Rref is at a middle point of the pre-programmed fuse resistance Ro and the post-programmed resistance Rf, i.e., $$Rref=(Ro+Rf)/2 \quad (Eq. 1)$$

so that the fuse SA 200 has the largest sensing margins for both pre and post programmed states.

Unfortunately, the conventional SA 200 lacks means to automatically maintain close to the ideal case expressed by Eq. 1 when process, voltage and temperature (PVT) varies as well as the fuse programming condition changes. Because, firstly, the reference resistor 202 and the resistive fuse 212 are typically made of different materials, hence having different PVT coefficients; secondly, when the chips including such resistive fuses 212 are sent to different customers, programming conditions, such as voltage, temperature and duration, can never be the same, i.e., Ro and Rf could be very different from one customer to another, while Rref is relatively fixed by the chip manufacturer. All these uncertainties may lower the performance of the conventional fuse SA 200.

Figure 3:
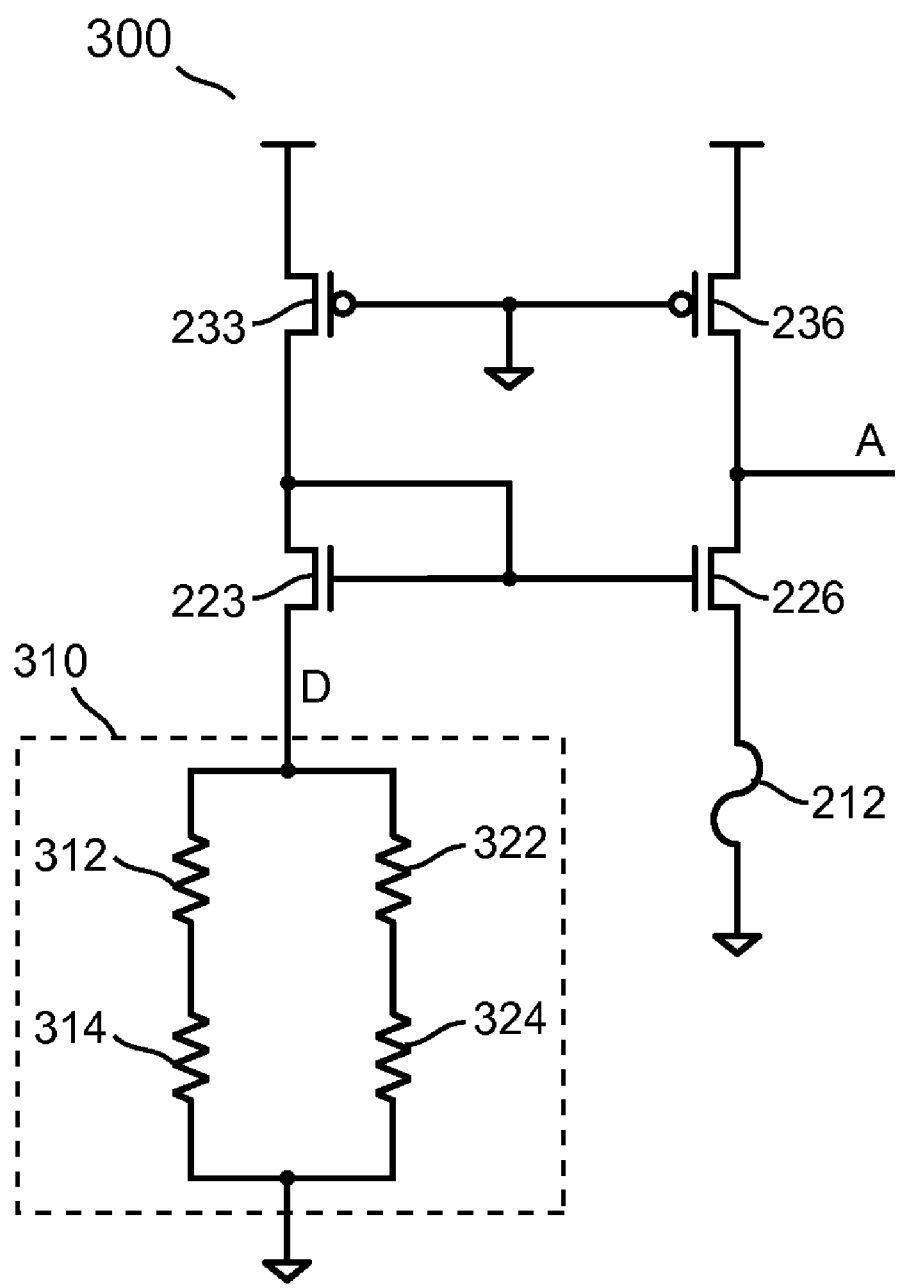
FIG. 3 is a schematic diagram illustrating a fuse sense amplifier having an automatic bias circuit according to an embodiment of the present invention.

FIG. 3 is a schematic diagram illustrating a fuse SA 300 having an automatic bias circuit 310 according to an embodiment of the present invention. The fuse SA 300 differs from the conventional fuse SA 200 only in that the reference resistor 202 of FIG. 2 is replaced by the automatic bias circuit 310 of FIG. 3. Referring to FIG. 3, the automatic bias circuit 310 comprises four resistors 312, 314, 322 and 324, with the resistors 312 and 314 serially connected forming a first branch, and the resistors 322 and 324 serially connected forming a second branch. The first and second branches are connected in parallel. A goal for the automatic bias circuit 310 is to track PVT variations and programming conditions of the resistive fuse 212, therefore, the resistors 312, 314, 322 and 324 are made identical to the resistive fuse 212. In a field application, two of the resistors, such as 312 and 322, remain un-programmed with a resistance Ro, while the other two resistors 314 and 324 are programmed with a resistance Rf. Then a total resistance, Rref, of the bias circuit 310 after the programming event becomes: Rref=(Ro+Rf)/2, which matches exactly Eq. 1. Because the resistors 312, 314, 322 and 324 are identical to the resistive fuse 212, and the resistors 314 and 324 are programmed with the same conditions as the resistive fuse 212, the automatic bias circuit 310 closely and automatically tracks the resistive fuse in field applications and provides a middle reference point for sensing the resistive fuse 212.

Figure 4:
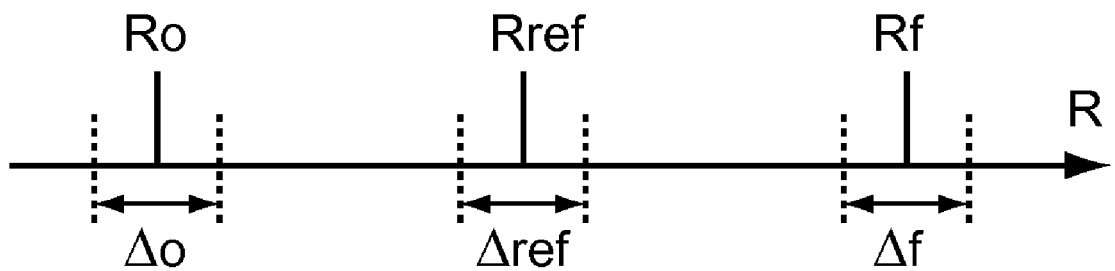
FIG. 4 shows resistance distributions of the bias circuit shown in FIG. 3.

FIG. 4 shows resistance distributions of the bias circuit 310 shown in FIG. 3. Inevitably, Ro and Rf have distributions Δo and Δf, respectively. Because of the way the resistors 312, 314, 322 and 324 are made and programmed as described above, Rref's distribution Δref tracks in sync with the Δo and Δf.

$$\Delta ref = \frac{1}{2}(\Delta o + \Delta f) \quad (Eq. 2)$$

Where Δref represent a range of the Rref's distribution, Δo represents a range of the Ro's distribution and Δf represents a range of the Rf's distribution.

Figure 1A:
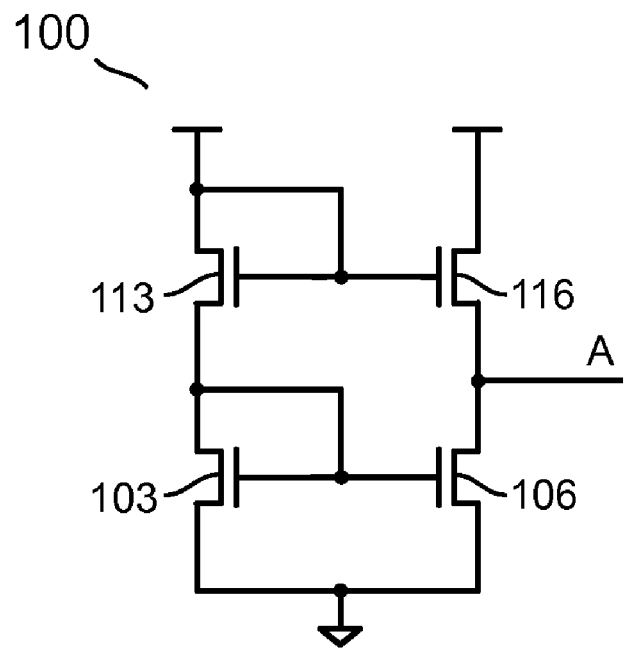
FIGS. 1A and 1B are schematic diagrams illustrating conventional bias circuits.
Figure 1B:
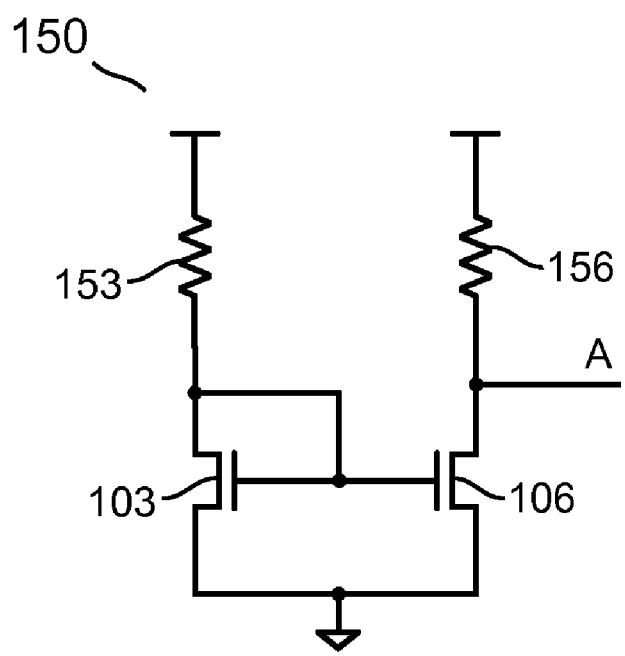

Therefore, the present invention provides at least two advantages. First, a closely and automatically tracked middle reference point increases sensing margins or sensitivity of a sense amplifier. Second, PVT environmental impacts are minimized not only by building the resistors 312, 314, 322 and 324 to be substantially identical to the resistive fuse 212, but also by using the passive resistors 312, 314, 322 and 324 of FIG. 3 instead of the active transistors 103 and 106 of FIG. 1.

Figure 5:
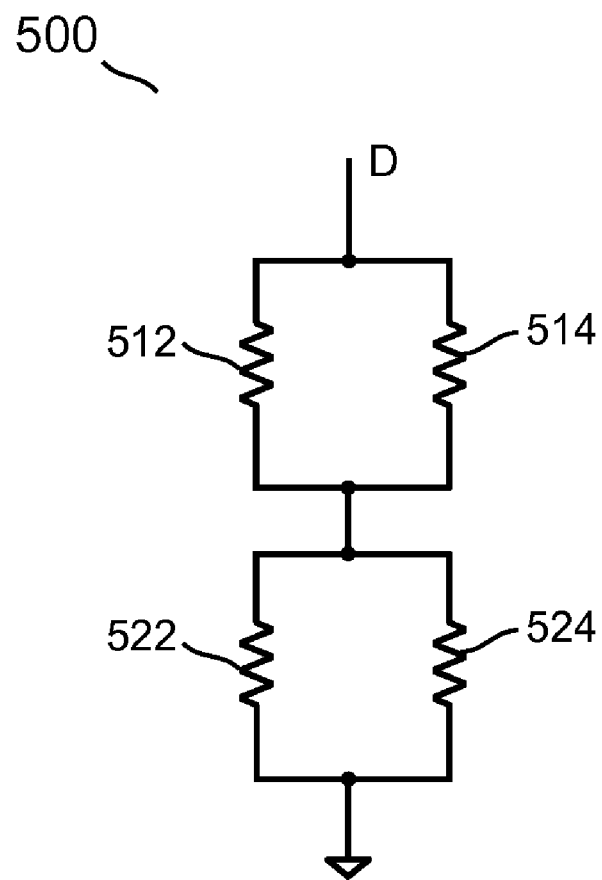
FIG. 5 is a schematic diagram illustrating another automatic bias circuit with an alternative connection according to another embodiment of the present invention.

FIG. 5 is a schematic diagram illustrating another automatic bias circuit 500 with an alternative connection according to another embodiment of the present invention. Resistors 512, 514, 522 and 524 are made the same as the resistive fuse 212 shown in FIG. 3. The resistors 512 and 514 are connected in parallel forming a first module. The resistors 522 and 524 are also connected in parallel forming a second module. Then the first and second modules are connected in series forming the bias circuit 500. In a field application, the resistors 512 and 514 remain un-programmed with a resistance Ro, and the resistors 522 and 524 are programmed with a resistance Rf, then a total resistance Rref=Ro/2+Rf/2, which matches exactly to the Eq. 1. Therefore, the bias circuit 500 functions exactly the same as the bias circuit 310 of FIG. 3.

Referring again to FIG. 5, one having ordinary skill in the art understands that if the resistors 522 and 524 remain un-programmed and the resistors 512 and 514 are programmed, the total resistance would still be the same as expressed by Eq. 1. Similarly, referring again to FIG. 3, when the resistors 314 and 324 remain un-programmed and the resistors 312 and 322 are programmed, the total resistance would be the same as expressed by Eq. 1 as well. Therefore, a key aspect of the present invention is that at least one un-programmed resistor and at least one programmed resistor are serially connected in a bias circuit.

As the SA circuits are very sensitive to parameter variations, in order to minimize such variations, the connections described in the above embodiments refer to physical and often metal connections.

Although a fuse SA is used herein to describe the embodiments of the present invention, one having skill in the art understands that applications of the present invention are not limited to the fuse SA, and both the device under sensing and the bias circuit are not limited to resistive elements as well.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A bias circuit for a sense amplifier having a device under sensing, the bias circuit comprising:
    a set of MOS transistors coupled between power supply terminals;
    the device under sensing having an un-programmed resistance value and a programmed resistance value, and coupled to the set of MOS transistors; and
    an automatic bias circuit coupled to the set of MOS transistors, comprising:
    at least one first device formed substantially the same as the device under sensing and having the un-programmed resistance value; and
    at least one second device formed substantially the same as the device under sensing and having the programmed resistance value, wherein the at least one first device comprises two of the first device connected in parallel and the at least one second device comprises two of the second device connected in parallel,
    wherein the bias circuit produces a reference resistance value for the device under sensing, the reference resistance value substantially equals to a middle level between the un-programmed and the programmed resistance values, and
    wherein the at least one first device and the at least one second device are serially connected.

2. The bias circuit of claim 1, wherein the least one first device comprises a first resistive fuse and a second resistive fuse.

3. The bias circuit of claim 1, wherein the least one second deice comprises a third resistive fuse and a fourth resistive fuse.

4. The bias circuit of claim 1, wherein when the device under sensing is a resistive device.

5. The bias circuit of claim 4, wherein the resistive device is a fuse.

6. The bias circuit of claim 1, wherein the device under sensing and the at least one second device are programmed by substantially the same conditions.

7. The bias circuit of claim 1, wherein the device under sensing and the at least one second device are programmed by applying a current in excess of normal operating current thereon.

8. The bias circuit of claim 1, wherein the set of MOS transistors comprise a first MOS transistor and a second MOS transistor coupled in series.

9. The bias circuit of claim 1, wherein the automatic bias circuit is further coupled to a third MOS transistor and a fourth MOS transistor coupled in series.

10. A bias circuit for a sense amplifier having a device under sensing, the bias circuit comprising:
    a set of MOS transistors coupled between power supply terminals;
    the device under sensing having an un-programmed resistance value and a programmed resistance value, and coupled to the set of MOS transistors; and
    an automatic bias circuit coupled to the set of MOS transistors, comprising:
    a first module having a first device and a second device connected in parallel and both formed substantially the same as the device under sensing and each having the un-programmed resistance value; and
    a second module having a third device and a fourth device connected in parallel and both formed substantially the same as the device under sensing and each having the programmed resistance value, wherein the bias circuit produces a reference resistance value for the device under sensing, the reference resistance value substantially equals to a middle level between the un-programmed resistance value and the programmed resistance value, and
    wherein the first and second modules are serially connected.

11. The bias circuit of claim 10, wherein when the device under sensing is a resistive device, the first, second, third and fourth devices are also resistive devices.

12. The bias circuit of claim 11, wherein the resistive device is a fuse.

13. The bias circuit of claim 10, wherein the device under sensing and the third and fourth devices are programmed by substantially the same conditions.

14. The bias circuit of claim 10, wherein the device under sensing and the third and fourth devices are programmed by applying a current in excess of normal operating current thereon.

15. A bias circuit for a sense amplifier having a device under sensing, the bias circuit comprising:
    a set of MOS transistors coupled between power supply terminals;
    the device under sensing having an un-programmed resistance value and a programmed resistance value, and coupled to the set of MOS transistors; and
    an automatic bias circuit coupled to the set of MOS transistors, comprising:
    a first branch having a first device and a second device serially connected and both formed substantially the same as the device under sensing, the first device having the un-programmed resistance value, and the second device having the programmed resistance value; and
    a second branch having a third device and a fourth device serially connected and both formed substantially the same as the device under sensing, the third device having the un-programmed resistance value, and the fourth device having the programmed resistance value, wherein the bias circuit produces a reference resistance value for the device under sensing, the reference resistance value substantially equals to a middle level between the un-programmed resistance value and the programmed resistance value, and
    wherein the first and second branches are connected in parallel.

16. The bias circuit of claim 15, wherein when the device under sensing is a resistive device, the first, second, third and fourth devices are also resistive devices.

17. The bias circuit of claim 16, wherein the resistive device is a fuse.

18. The bias circuit of claim 15, wherein the device under sensing and the second device are programmed by substantially the same conditions.

19. The bias circuit of claim 15, wherein the device under sensing and the fourth device are programmed by substantially the same conditions.

20. The bias circuit of claim 15, wherein the device under sensing and the second and fourth devices are programmed by applying a current in excess of normal operating current thereon.

* * * * *